(12) United States Patent
Miehlich

(10) Patent No.: US 12,211,721 B2
(45) Date of Patent: Jan. 28, 2025

(54) COMPONENT CONVEYING INSTRUMENT WITH AN ADJUSTING UNIT AND METHOD OF ADJUSTING A COMPONENT CONVEYING INSTRUMENT

(71) Applicant: Muehlbauer GmbH & Co. KG, Roding (DE)

(72) Inventor: Rainer Miehlich, Taufkirchen (DE)

(73) Assignee: MUEHLBAUER GMBH & CO. KG, Roding (DE)

( * ) Notice: Subject to any disclaimer, the term of this patent is extended or adjusted under 35 U.S.C. 154(b) by 483 days.

(21) Appl. No.: 17/597,037

(22) PCT Filed: Jun. 17, 2020

(86) PCT No.: PCT/EP2020/066753
§ 371 (c)(1),
(2) Date: Dec. 23, 2021

(87) PCT Pub. No.: WO2020/260091
PCT Pub. Date: Dec. 30, 2020

(65) Prior Publication Data
US 2022/0270902 A1    Aug. 25, 2022

(30) Foreign Application Priority Data

Jun. 25, 2019 (DE) .......................... 102019004470.3

(51) Int. Cl.
*H01L 21/67* (2006.01)
*G06T 3/60* (2006.01)
(Continued)

(52) U.S. Cl.
CPC .......... *H01L 21/67721* (2013.01); *G06T 3/60* (2013.01); *G06T 7/68* (2017.01);
(Continued)

(58) Field of Classification Search
CPC ......... H01L 21/67721; H01L 21/67144; H01L 21/67259; H01L 21/681; G06T 3/60; G06T 7/68; G06T 2207/30148
See application file for complete search history.

(56) References Cited

U.S. PATENT DOCUMENTS 10,056,278 B2    8/2018   Cheng et al.
2012/0045852 A1    2/2012   Baccini et al.
(Continued)

FOREIGN PATENT DOCUMENTS

DE    102015013495 A1    4/2017

*Primary Examiner* — Michael W Choi
(74) *Attorney, Agent, or Firm* — John A. Miller; Shumaker, Loop & Kendrick, LLP

(57) ABSTRACT

A component conveying instrument comprising a first and second conveying instrument for conveying a component. The first conveying instrument is arranged to transfer the component to the second conveying instrument at a transfer location. The component conveying instrument further comprises an adjustment unit for adjusting one of the conveying instruments relative to the other conveying instrument along at least one or about at least one adjustment axis and an imaging unit. The imaging unit captures at least one image of the transfer location showing an end region of the first conveying instrument, and an end region of the second conveying instrument. The component conveying instrument also comprises an analyzing unit for analyzing the image, where the analyzing unit is coupled to the adjusting unit and is adapted to determine an asymmetry measure between the end region of the first conveying instrument and the end region of the second conveying instrument.

14 Claims, 18 Drawing Sheets

(51) Int. Cl.
*G06T 7/68* (2017.01)
*H01L 21/677* (2006.01)
*H01L 21/68* (2006.01)

(52) U.S. Cl.
CPC .. *H01L 21/67144* (2013.01); *H01L 21/67259* (2013.01); *H01L 21/681* (2013.01); *G06T 2207/30148* (2013.01)

(56) References Cited

U.S. PATENT DOCUMENTS

2018/0053671 A1  2/2018  Cheng et al.
2018/0113466 A1*  4/2018  Schulze ............... G05D 1/0293

\* cited by examiner

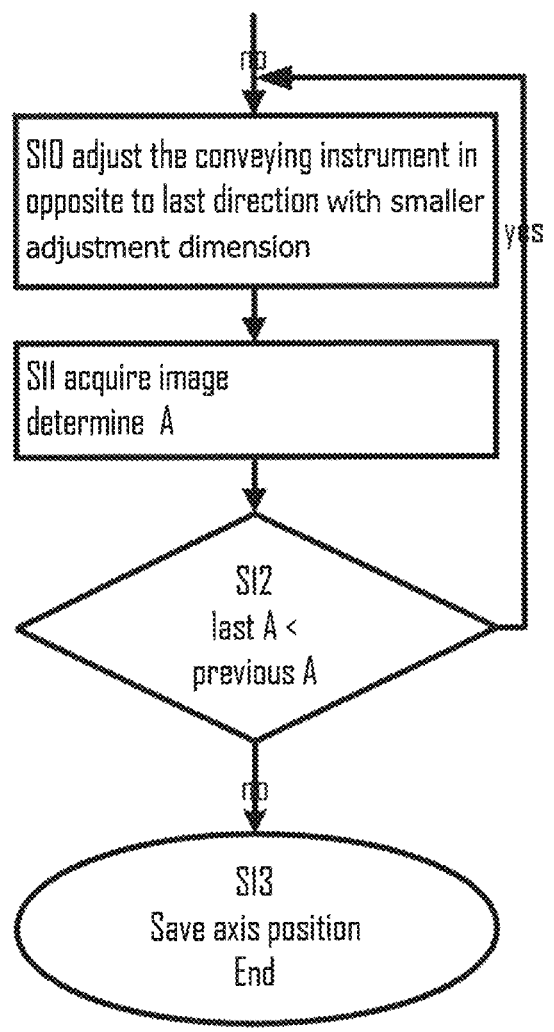

COMPONENT CONVEYING INSTRUMENT WITH AN ADJUSTING UNIT AND METHOD OF ADJUSTING A COMPONENT CONVEYING INSTRUMENT

CROSS-REFERENCE TO RELATED APPLICATIONS

This application is a National Stage application of International Application No. PCT/EP2020/066753 filed on Jun. 17, 2020 which claims priority to German Patent Application Serial No. DE 10 2019 004 470.3 filed Jun. 25, 2019.

BACKGROUND

Field

A component conveying instrument having a first conveying instrument and a second conveying instrument for conveying the component is described herein. The component may in particular be an electronic semiconductor component, such as a chip. Here, the first conveying instrument is arranged to transfer the component to the second conveying instrument at a transfer location. Furthermore, a method for adjusting such a component conveying instrument is described.

Discussion of the Related Art

A component conveying instrument for conveying chips is known from DE 10 2015 013 495 A1. The device comprises a first star-shaped turning device which is rotatable about a first horizontal axis and has, along the circumference, a plurality of conveying instruments in the form of pick-ups with suction contact points for picking up chips. The first turning device can be used to receive chips from a wafer, and then turn the chips by rotating the first turning device 180°. Further, the apparatus comprises a second star-shaped turnover device having corresponding pickups and being rotatable about a second horizontal axis oriented perpendicular to the first-horizontal axis.

A chip to be conveyed is picked up from the wafer by a pickup of the first turnover device located in a pickup position. Then the first turning device is turned by 180°, whereby the pick-up is moved from the pick-up position to a transfer position. There, a transfer of the chip from the pickup of the first turning device located in the transfer position to a pickup of the second turning device located in a transfer position takes place. The second turnover device is then rotated, causing the pickup of the second turnover device to move from the transfer position to another position. A controller is used to drive the turnover device. Furthermore, the device comprises position sensors for detecting position data of the turning devices, which are made available to the control system.

For a reliable transfer of the chips at the transfer location, the two respective transducers, each in its transfer position, must be aligned exactly in relation to each other. Precise adjustment of this relative alignment is carried out with considerable effort by manually adjusting the two turning devices.

A device for conveying electronic components is known from U.S. Pat. No. 10,056,278 B2. The device comprises a removal device rotatable about a horizontal axis with circularly arranged pick-ups for picking up chips from a wafer. By rotating the pickup device, the picked up chips are turned by 180°. Further, the apparatus comprises a conveyor device rotatable about a vertical axis and having circularly arranged pickups which receive the chips detached from the removal device at a transfer location. The chips are then conveyed further by rotating the conveying instrument about the vertical axis. When a chip is transferred, the relevant pick-up of the removal device is accordingly in a transfer position and likewise the relevant pick-up of the conveying instrument is in a transfer position. For precise mutual alignment of these two pick-ups at the transfer position, the device comprises a first downwardly directed camera for taking images of the pick-ups of the removal device and a second upwardly directed camera for taking images of the pick-ups of the conveying instrument. Using the images acquired by these cameras, a deviation is calculated between two pickups located in their preset transfer positions. This distance is used to accurately set the transducers to each other or adjust them at the transfer location.

Vectors are used to calculate the distances, which describe the positions of the contact points of the transducers intended for connection to the chip. As a result, these calculations require a comparatively high computing effort. Furthermore, the downward pointing camera is arranged between two transducers of the conveyor. This is associated with a corresponding space requirement, which—restricts the design freedom of the conveyor device. In addition, the upwardly directed camera is arranged away from the transfer location. Therefore, it cannot be used to take a picture of the relevant pick-up of the conveyor device when this pick-up is in its transfer position. Instead, after the image has been taken, the conveyor device must be rotated further until the relevant pick-up is in its transfer position. However, in this state it is no longer possible to check the mutual alignment of the transducers with the aid of the upward pointing camera. This fundamentally limits the achievable accuracy.

A correspondingly improved component conveying instrument is intended to facilitate and at the same time effectively adjust the two conveying instruments in their positions intended for the transfer.

SUMMARY

This task is solved by a component conveying instrument with a first conveying instrument for conveying a component and a second conveying instrument for conveying the component, where the first conveying instrument is set up to transfer the component to the second conveying instrument at a transfer location. In this respect, the first conveying instrument has in particular a main axis along which at least a portion of an intended transfer path runs. Further, the component conveying instrument comprises an adjustment unit for adjusting one of the two conveying instruments relative to the other conveying instrument along at least one or about at least one adjustment axis, and an imaging unit adapted to acquire at least one image of the transfer location showing, in a first portion of the at least one image, at least an end region of the first conveying instrument, and, in a second portion of the at least one image, at least an end region of the second conveying instrument. Further, the component conveying instrument comprises an analysis unit, coupled to the adjustment unit, for analyzing the at least one image, the analysis unit being arranged to determine, for the at least one image, a asymmetry measure between the end region of the first conveying instrument and the end region of the second conveying instrument, the adjustment unit being arranged to adjust at least one of the two conveying instruments relative to the respective other conveying instrument along the at least one adjustment axis or about the at least one adjustment axis in dependence on the determined measure of asymmetry.

By using only one view of the end regions of the two conveying instruments in question, a suitable asymmetry measure for the relative arrangement of the two end regions can be obtained by means of a comparatively simple analysis based on a simple symmetry within comparatively short computing time with simple computing operations. In this way, a simple design of the analysis unit is enabled. The short computing time allows the adjustment process of the two conveying instruments performed by the adjustment unit to require particularly little time overall.

In one variant, the end region of the first conveying instrument has a provided contact point for the component to be conveyed, which is formed approximately (axially) symmetrically with respect to the shape of the end region of the first conveying instrument, and the end region of second conveying instrument has a provided contact point for the component to be conveyed, which is formed approximately (axially) symmetrically with respect to the shape of the end region of the second conveying instrument. For example, the first or the second conveying instrument may be a pipette whose end region has, to a first approximation, a frustoconical shape, the contact point provided being formed symmetrically about the central longitudinal axis or symmetrical axis of the frustoconical shape. This enables a particularly simple and at the same time precise determination of the mutual, registered alignment of the two end regions.

In one variant, the analysis unit is arranged to use a symmetry between the end region of the first conveying instrument and the end region of the second conveying instrument a mirror axis which is either oriented perpendicular to the transfer path or coincides with the transfer path to determine the asymmetry measure. This allows a particularly simple analysis of the image to determine the measure of asymmetry.

In one variant, the mirror axis is selected to be oriented perpendicular to the transfer path, passing through the center of the transfer path. In other words, in this case, the contact point of the end portion of the first conveying instrument intended for contact with the component is equidistant from the mirror plane, as is the contact point of the end portion of the second conveying instrument intended for contact with the component. In this way, the determination of the asymmetry measure is suitably related to the two contact points.

In one variant, the analysis unit is adapted to determine the asymmetry measure by
(a) to acquire a grey value for each pixel on one side of the mirror axis,
(b) to determine the mirrored image point for the image point under consideration with the mirror axis in each case and to record its grey value,
(c) to determine in each case a difference value which is a measure of the difference between the grey value of the pixel and the grey value of the mirrored pixel, and
(d) to sum up all the difference values determined in this way,
wherein the sum formed in step (d) determines the asymmetry measure to the image in question. In one variant, the sum is used directly as the asymmetry measure. In an alternative variant, the sum is normalized using further image information, the normalized value being used as the asymmetry measure.

This is a particularly simple and effective calculation rule for determining the asymmetry measure.

For example, the square of the difference of the grey values may be used as the difference value. According to an alternative, the amount of the difference of the grey values can be used as the difference value.

In an alternative variant, the analysis unit is arranged to determine the asymmetry measure for the image concerned by
(a) to create a mirror image, which is generated by a reflection around a mirror axis, which is at least approximately parallel to the movement path (W),
(b) to acquire the grey values for each pixel of the image and the corresponding pixel of the mirror image,
(c) to determine in each case a difference value which represents a measure of the difference between the grey value of the pixel and the grey value of the corresponding pixel of the mirror image,
(d) to sum up all the difference values determined in this way,
(e) producing at least one further mirror image by moving the mirror image produced in step (a) in a direction perpendicular to the mirror axis, and
(f) repeating steps (a) to (d) using the at least one further mirror image,
wherein the respective sums produced in step (d) are compared and the minimum of the sums determines the asymmetry measure for the image concerned. This also enables a particularly simple and effective determination of the asymmetry measure.

In one variant, a plurality of further mirror images are generated in step (e), each of the plurality of mirror images being generated by a simple shift perpendicular to the side edge of the mirror image generated in step (a). This requires little computational effort. A desired accuracy can be achieved simply by selecting a distance between the plurality of mirror images to be larger or smaller.

In one variant, the imaging unit is set up in such a way that a side edge of the at least one image is oriented at least approximately parallel to the intended transfer path. For the creation of the mirror image in step (a), the side edge is then used as the mirror axis. An advantage here is that no mirror axis needs to be determined by image analysis. In one variant, the side edge includes with the intended transfer path derivable from the image an angle which is smaller than a predetermined limit angle. The limit angle may be, for example, about 3°-about 10°.

In one variant, the component conveying instrument is arranged to perform the following steps—in the given order:
(i) acquire a first image with the imaging unit;
(ii) determining the asymmetry measure of the first image by the analysis unit;
(iii) adjustment of one of the two conveying instruments relative to the other conveying instrument in a first direction by the adjustment unit;
(iv) acquire a second image with the imaging unit;
(v) determining the asymmetry measure of the second image by the analysis unit;
(vi) comparing the asymmetry measure of the second image with the asymmetry measure of the first image by the analysis unit;
(vii) if the asymmetry measure of the second image is smaller than the asymmetry measure of the first image: further adjusting one conveying instrument relative to the respective other conveying instrument in the first direction by the adjustment unit; and if the asymmetry measure of the second image is greater than or equal to the asymmetry measure of the first image: adjusting one conveying instrument relative to the respective other conveying instrument in a second direction opposite to the first direction by the adjustment unit.

In this way, a particularly effective and at the same time simple adjustment of the two support instruments for mutual alignment can be achieved.

In one variant, the component conveying instrument is further arranged for subsequently performing the following further steps in the given order:
- (viii) acquiring a third image with the imaging unit;
- (ix) determining the asymmetry measure of the third image by the analysis unit;
- (x) comparing the asymmetry measure of the third image with the asymmetry measure of the second image by the analysis unit;
- (xi) if the asymmetry measure of the third image is smaller than the asymmetry measure of the second image: further adjusting one conveying instrument with respect to the other conveying instrument concerned in the direction of the last adjustment by the adjustment unit; and if the asymmetry measure of the third image is greater than or equal to the asymmetry measure of the second image: adjusting one conveying instrument with respect to the other conveying instrument concerned in the direction opposite to the direction of the last adjustment by the adjustment unit.

In one variant, it is provided that further images are then recorded and the process is continued in an analogous manner until the values of the asymmetry measures pass through a minimum. After passing through the minimum, one of the conveying instruments is then moved in the opposite direction to the last direction, e.g. until the minimum is reached again. Then the two end regions—seen from the direction of view of the imaging unit—are aligned with each other with a desired accuracy.

The accuracy can be set to a desired level by selecting a greater or lesser path length when adjusting one of the conveying instruments. The smaller the path length selected for adjustment, the greater the achievable accuracy.

In one variant, the first delivery instrument and/or the second delivery instrument is formed by a pipette or an ejector or a pick-up having a suction contact point. These types of conveying instruments typically have end portions whose shapes are simple and are formed symmetrically around the provided contact point. Therefore, the analysis unit described herein is particularly suitable in this case.

In one variant, the first conveying instrument and/or the second conveying instrument is part of a conveying instrument which is mounted so as to be linearly movable along an axis and/or rotatable about an axis of rotation, wherein, by means of a presetting movement of the conveying instrument along the axis or about the axis of rotation, the conveying instrument in question can be moved into a transfer position intended for the transfer of the component along the transfer path, and wherein the setting unit is set up to adjust the transfer position of the conveying instrument in question, for transferring the component along the transfer path, and wherein the adjustment unit is arranged to move the respective conveying instrument along the axis and/or to rotate about the axis of rotation in order to adjust the transfer position of the respective conveying instrument. Therefore, a drive unit of the component conveying instrument which serves to drive the conveying instrument can functionally advantageously be used both for moving the conveying instrument when conveying the components and for setting or adjusting the transfer position of the conveying instrument concerned.

In one variant, the conveying instrument is a turnover device or a linear axis.

In a variant, the first conveying instrument is part of a first reversing device and the second conveying instrument is part of a second reversing device.

In a variant, the adjustment axis forms an angle of between 70° and 110° with the main axis of the first conveying instrument. It is assumed that the first conveying instrument is in the transfer position. For example, this angle can be 90°. In this way, an adjustment can be effected in which the length of the transfer path practically does not change.

In one variant, a direction from the imaging unit to the transfer position includes an angle with the major axis of the first conveying instrument that is between 70° and 110°. The first conveying instrument is assumed to be in the transfer position. In this way, the end areas of the two conveying instruments can be imaged by the imaging unit with practically no distortion of perspective.

In one variant, the component conveying instrument also has a further imaging unit which is set up to record at least one further image of the transfer location which, in a first section of the at least one further image, shows at least one end region of the first conveying instrument and, in a second section of the at least one further image, shows at least one end region of the second conveying instrument, a direction from the further imaging unit to the transfer location differing from a direction from the first-mentioned imaging unit to the transfer location. Thus, using the further imaging unit, a mutual adjustment or fine adjustment of the two conveying instruments relative to each other in a further plane can be effected.

In one variant, the two directions mentioned differ by more than 70°. This means that the two imaging units can be used to assess the end areas from significantly different viewing directions. This allows the accuracy to be further increased.

If the two directions from which the two imaging units are directed towards the transfer location differ by about 90°, the two conveying instruments can be precisely aligned with each other particularly easily. Therefore, in one variant, it is provided that the direction from which the first-mentioned imaging unit is directed towards the transfer location and the direction from which the further imaging unit is directed towards the transfer location differ by an angle which is between 70° and 110°, preferably between 80° and 100°.

In one variant, the analysis unit is further arranged to analyse the at least one further image and to determine a further asymmetry measure between the end region of the first conveying instrument and the end region of the second conveying instrument, the adjustment unit being arranged to adjust at least one of the two conveying instruments relative to the respective other conveying instrument along or about a further adjustment axis in dependence upon the determined further measure of asymmetry.

A method of setting a component conveying apparatus having a first conveying instrument for conveying a component and a second conveying instrument for conveying the component, wherein the first conveying instrument is arranged to transfer the component to the second conveying instrument at a transfer location along an intended transfer path, comprising the following steps:
- (i) acquiring a first image of the transfer location with an imaging unit;
- (ii) determining an asymmetry measure of the first image by an analysis unit;
- (iii) adjusting one of the two conveying instruments relative to the other conveying instrument in a first direction by means of an adjustment unit;

(iv) acquiring a second image of the transfer location with the imaging unit;
(v) determining an asymmetry measure of the second image by the analysis unit;
(vi) comparing the asymmetry measure of the second image with the asymmetry measure of the first image by the analysis unit;
(vii) if the asymmetry measure of the second image is smaller than the asymmetry measure of the first image: further adjusting the one conveying instrument relative to the respective other conveying instrument in the first direction by the adjustment unit; and if the asymmetry measure of the second image is greater than or equal to the asymmetry measure of the first image: adjusting the one conveying instrument relative to the respective other conveying instrument in a second direction opposite to the first direction by the adjustment unit.

BRIEF DESCRIPTION OF THE DRAWINGS

Further features, characteristics, advantages and possible variations will become clear to a person skilled in the art from the following description, in which reference is made to the accompanying drawings. In this respect, the figures schematically show variants of a component conveying instrument, without limiting the variants of the described device to the latter.

FIG. 2l shows a diagram representing asymmetry measures of the images outlined in FIGS. 2a to 2k.

FIGS. 5a and 5b show a flow diagram for a setting method for a component conveying instrument.

DETAILED DESCRIPTION OF THE EMBODIMENTS

Figure 1:
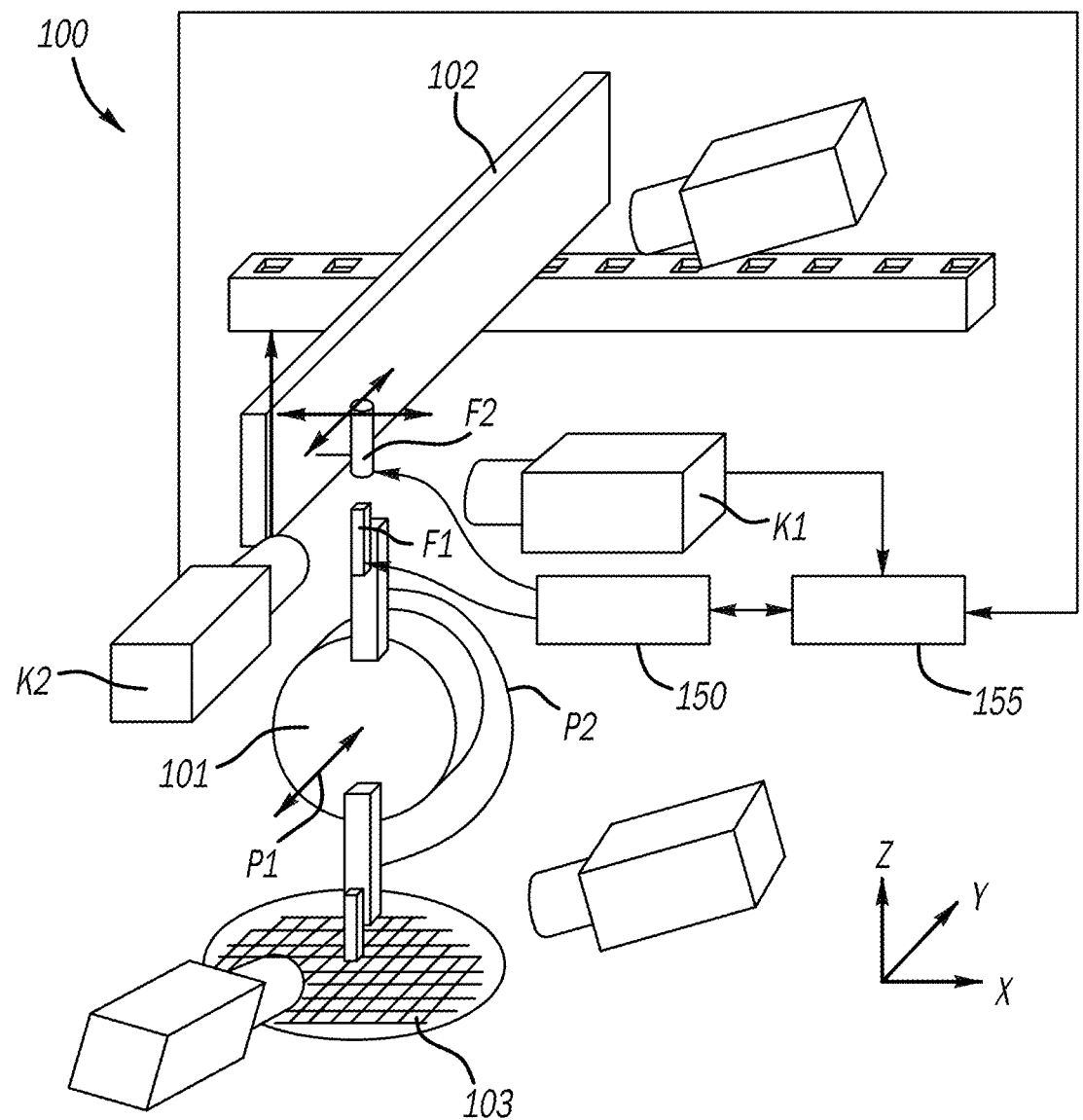
FIG. 1 shows a perspective sketch of a component conveying device with a transfer location between a first conveying instrument and a second conveying instrument.
Figure 1A:
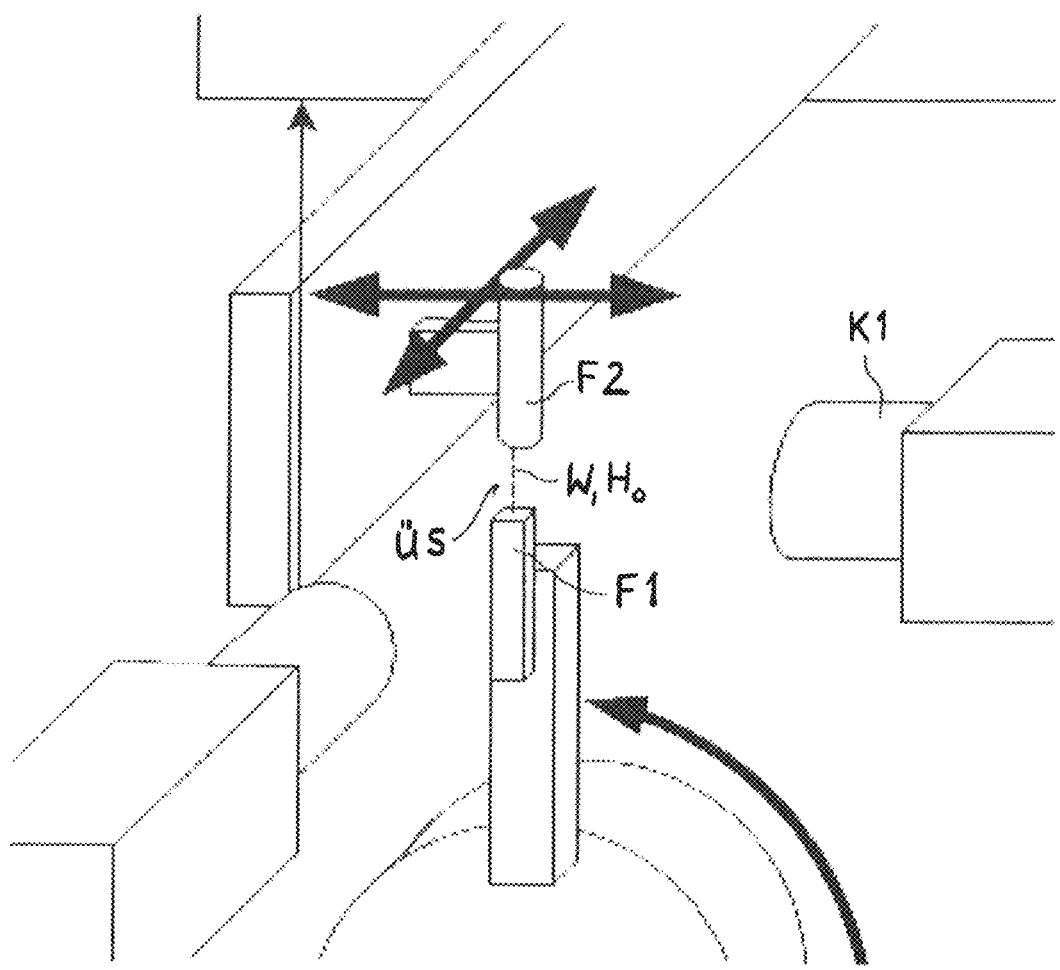
FIG. 1a shows a detail from FIG. 1 around the transfer location.

FIG. 1 shows a perspective sketch of a component conveying instrument 100. The component conveying instrument 100 comprises a first conveying instrument 101 with a first conveying instrument F1 for conveying an electronic component and a second conveying instrument 102 with a second conveying instrument F2 for conveying the component. In the example shown, the two conveying instruments F1, F2 are so-called pick-ups. FIG. 1a shows an area around the two conveying instruments F1, F2 in more detail.

The transfer the component at a transfer location ÜS along an intended transfer path W to the second conveying instrument F2. In this case, the first conveying instrument F1 has a main axis $H_0$ along which at least a section of the intended transfer path W runs.

The first conveying instrument 101 is a turning device which is mounted movably relative to a housing (not shown in FIG. 1) of the component conveying instrument 100, so that it can be moved linearly along an axis and can be rotated about an axis of rotation. In the illustration of FIG. 1, the y-axis of a Cartesian coordinate system is selected as the axis and as the axis of rotation. The linear movement option is indicated by a first arrow P1, the rotary movement option by a curved second arrow P2. A control system of the component conveying instrument 100 (not shown in the figure) is used to move the first conveying instrument 101.

The first conveying instrument 101 further comprises another conveying instrument arranged opposite the first conveying instrument F1 with respect to the y-axis. In a variant not shown, the first conveying instrument 101 comprises more than two conveying instruments, for example four or eight corresponding conveying instruments arranged uniformly around the y-axis.

By rotating the first conveying instrument 101 about the y-axis, the first conveying instrument F1 is rotated about the y-axis so that it can be brought into different positions. Thereby, a transfer position, outlined in FIG. 1, is provided for transferring the component from the first conveying instrument F1 to the second conveying instrument F2 at the transfer location ÜS. A pick-up position of the first conveying instrument F1, which is opposite the transfer position with respect to the y-axis, for example, is provided for picking up the component from a structured component supply 103, such as a wafer.

The second conveying instrument 102 is a linear axis that is mounted for movement relative to the housing, such that it can be moved along the y-axis and along the x-axis by the controller. By moving the second conveying instrument 102 along the x-axis and/or along the y-axis, the second conveying instrument F2 is moved to different positions. A transfer position, outlined in FIG. 1, is provided for transferring the component from the first conveying instrument F1 to the second conveying instrument F2 at the transfer location ÜS. The second conveying instrument 102 may deposit the component at a deposit location in or on a receiving device (not shown). Such a receiving device may be, for example, a (wafer) table providing a receiving substrate or a component belt having receiving pockets for components.

For a safe transfer of the component from the first conveying instrument F1 to the second conveying instrument F2, an exact alignment of the first conveying instrument F1 and the second conveying instrument F2 is required. Otherwise, there is a risk that the component will fall during the transfer.

For this purpose, the component conveying instrument 100 further comprises an adjustment unit 150 with which one of the two conveying instruments F1, F2 can be set or adjusted relative to the respective other conveying instrument along at least one or around at least one adjustment axis. For adjustment, the two conveying instruments F1, F2 are accordingly first brought into their respective transfer position by presetting. Subsequently, a fine adjustment or adjustment of the mutual alignment of the two conveying instruments F1, F2 is carried out with the aid of the adjustment unit 150.

In other words, the adjusting device is used to adjust at least one of the two transfer positions so that the two conveying instruments F1, F2 are thereby precisely aligned with each other. In the example shown, the transfer position of the first conveying instrument F1 can be adjusted or set with the adjusting unit by moving the first conveying instrument 101 along the y-axis or by rotating the first conveying instrument 101 about the y-axis. The transfer position of the second conveying instrument F2 can be adjusted with the adjusting unit by moving the second conveying instrument 102 along the x-axis and/or by moving the second conveying instrument 102 along the y-axis.

Further, the second conveying instrument 102 may also be moved along the z-axis by the controller.

In a variant not shown, the second conveying instrument 102 is designed as a further turning device which corresponds in structure to the first-mentioned turning device, but the axis of rotation of the further turning device encloses an angle of more than 0° with the axis of rotation of the first-mentioned turning device, i.e. the y-axis. In one variant, the axis of rotation of the further turning device is the x-axis. In a further variant not shown, the axis of rotation of the first reversing device and the second reversing device is the y-axis.

Figure 3:
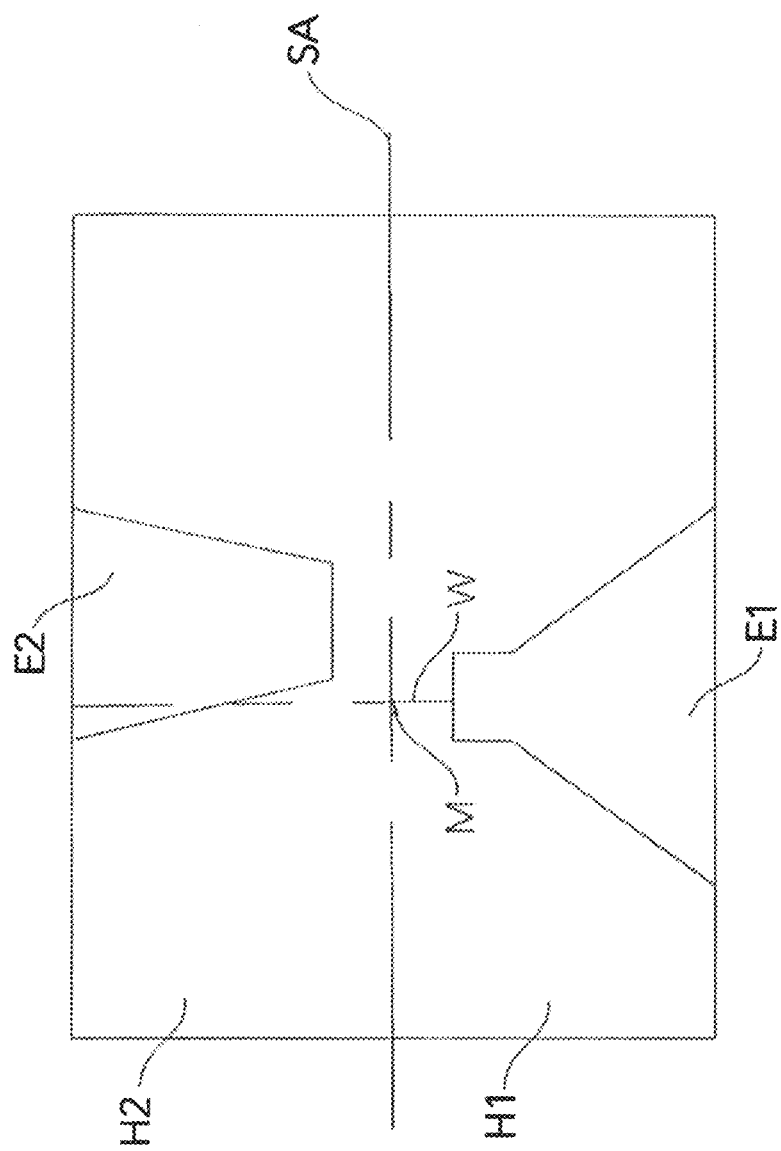
FIG. 3 shows a principle sketch of an image of the transfer location captured by the imaging unit.

Furthermore, the component conveying instrument 100 has an imaging unit K1 which is set up to record at least one image of the transfer location US, sketched by way of example in FIG. 3, which image shows at least one end region E1 of the first conveying instrument F1 in a first section H1 of the image, and at least one end region E2 of the second conveying instrument F2 in a second section H2 of the image. In FIG. 3, the main axis of the first conveying instrument F1 is sketched, along which at least a section of the aforementioned transfer path W runs. The component conveying instrument 100 also includes an imaging unit K2 that is configured to capture at least one image of the transfer location, where a first portion of the at least one image captured by the imaging unit K2 shows at least one end region of the conveying instrument F1 and a second portion of the at least one image captured by the imaging unit K2 shows at least one end region of the conveying instrument F2, and where a direction from the imaging unit K2 to the transfer location is different than a direction from the imaging unit K1 to the transfer location.

Furthermore, the component conveying instrument 100 has an analysis unit 155, coupled to the adjustment unit 150, for analyzing the at least one image, which analysis unit 155 is set up to determine, for the at least one image, a measure of an asymmetry between the end region E1 of the first conveying instrument F1 and the end region E2 of the second conveying instrument F2—in short, an asymmetry measure. The adjustment unit 150 is set up to adjust the first conveyor instrument F1 relative to the second conveying instrument F2 along the adjustment axis—in this case the y-axis—as a function of the determined asymmetry measure.

The following describes the steps for setting or adjusting the—mutual alignment of the two conveying instruments F1, F2.

After the two conveying instruments F1, F2 have been brought into their respective transfer positions by moving the two conveying instruments F1, F2 accordingly, the following steps are carried out in the order indicated:
  (i) acquiring a first image with the imaging unit K1;
  (ii) determining the asymmetry measure of the first image by the analysis unit 155;
  (iii) adjusting one of the two conveying instruments F1 and F2, here exemplarily the second conveying instrument F2 with respect to the respective other conveying instrument F1 in a first direction, here exemplarily the y-direction by the adjustment unit 150;
  (iv) acquiring a second image with the imaging unit K1;
  (v) determining the asymmetry measure of the second image by the analysis unit 155;
  (vi) comparing the asymmetry measure of the second image with the asymmetry measure of the first image by the analysis unit 155;
  (vii) of the asymmetry measure of the second image is smaller than the asymmetry measure of the first image: further adjustment of the second conveying instrument F2 relative to the first conveying instrument F1 in the y-direction by the adjustment unit 150; and if the asymmetry measure of the second image is greater than or equal to the asymmetry measure of the first image: adjustment of the second conveying instrument F2 relative to the first conveying instrument F1 in a second direction opposite to the y-direction, i.e. in the "−y" direction, by the adjustment unit 150.

In this way, the second conveying instrument F2 is brought closer to the desired aligned orientation.

The steps can then be repeated using additional images until a desired precision of mutual alignment of the two conveying instruments F1, F2 is achieved.

If the first conveying instrument F1 is adjusted in relation to the second conveying instrument F2, the result is completely analogous.

In FIGS. 2a to 2k, on the basis of corresponding images B1, B2, B3 . . . B11 of the transfer location ÜS taken with the imaging unit K1, an exemplary and highly simplified case is sketched in which the second conveying instrument F2 is appropriately adjusted several times.

Figure 2A:
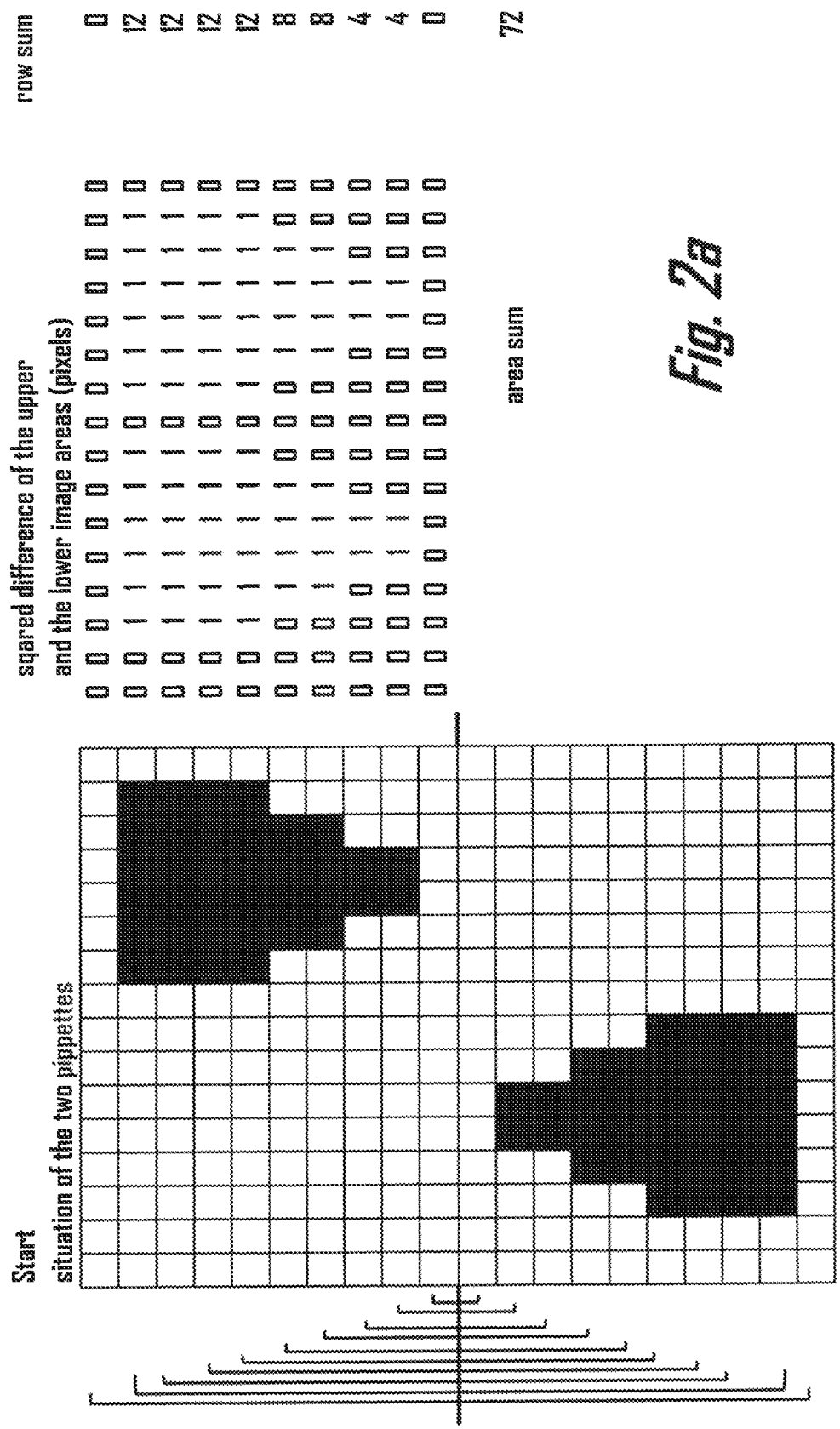
FIGS. 2a to 2k schematically show images of the transfer location taken with an imaging unit of the component conveying device, wherein the second conveying instrument is adjusted in different ways with respect to the first conveying instrument.

On the left side of FIG. 2a, the first image B1 is sketched. The end region E1 of the first conveying instrument F1, also referred to here by way of example as a "pipette", and correspondingly the end region E2 of the second conveying instrument F2 and the mirror axis SA can be seen by black marking on a white background. In addition, the main axis $H_0$ of the first conveying instrument F1 is sketched.

After acquiring the first image B1 in step (i) above, the associated asymmetry measure for the first image B1 is determined in step (ii), referred to herein as the first asymmetry measure A1. The manner in which an asymmetry measure for an image is determined is discussed in more detail below.

Figure 2B:
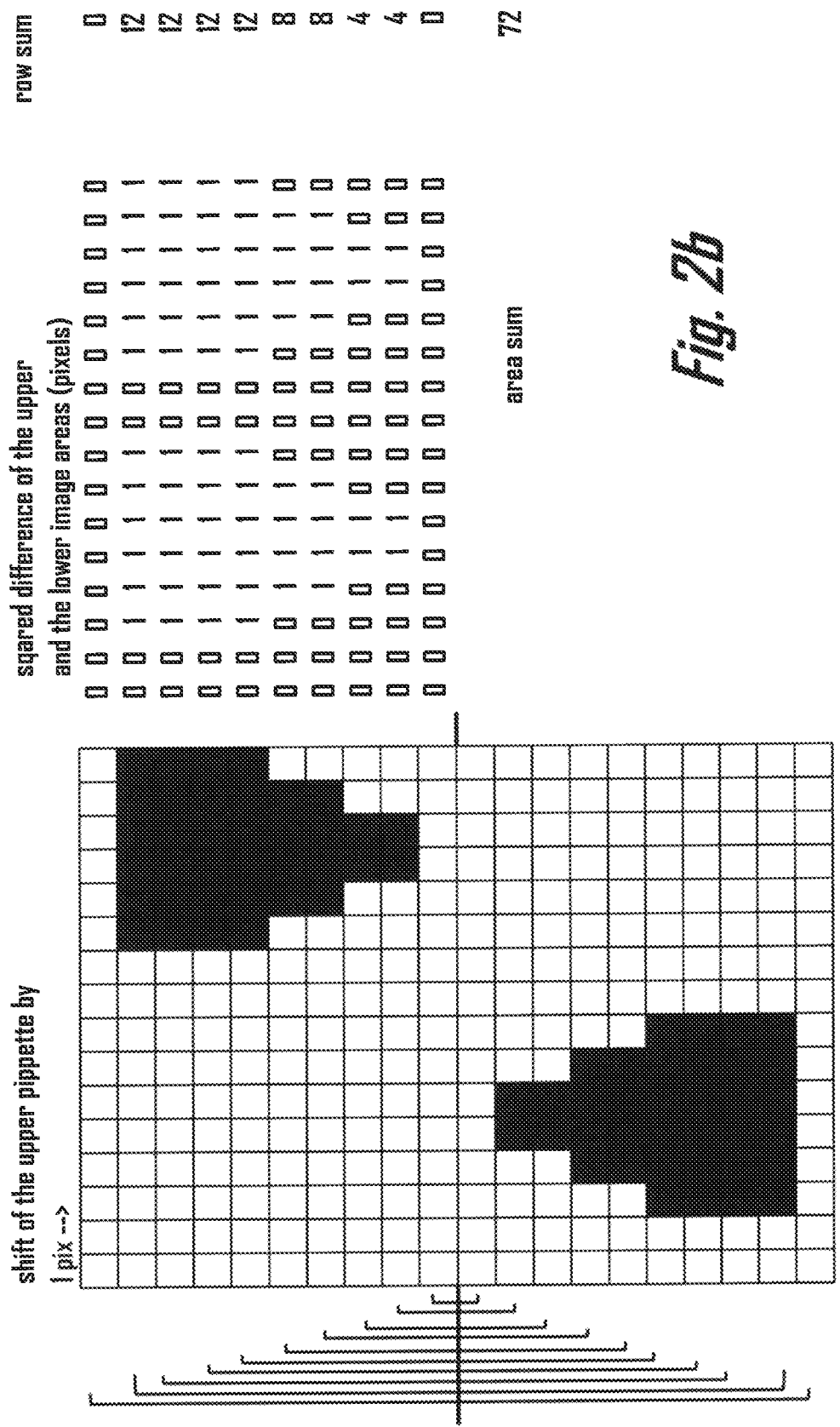

In step (iii), starting from the start situation shown in FIG. 2a, the second conveying instrument F2 is adjusted in a first direction, here exemplarily to the right, by a small adjustment amount. Then, in step (iv), the second image B2 shown in FIG. 2b is acquired. In the example shown, the rightward adjustment is made by the width of one pixel, as indicated by "1 pix→" in the upper left of FIG. 2b. In general, the small adjustment dimension can be, for example, a fraction of a millimeter and is—basically freely selectable depending on the desired accuracy of the adjustment.

Then, in step (v), the second asymmetry measure A2 is determined for the second image B2 in a corresponding manner.

In step (vi), the first asymmetry measure A1 and the second asymmetry measure A2 are then compared. In the example shown—as will be—explained in more detail below—the second asymmetry measure A2 is the same size as the first asymmetry measure A1.

Figure 2C:
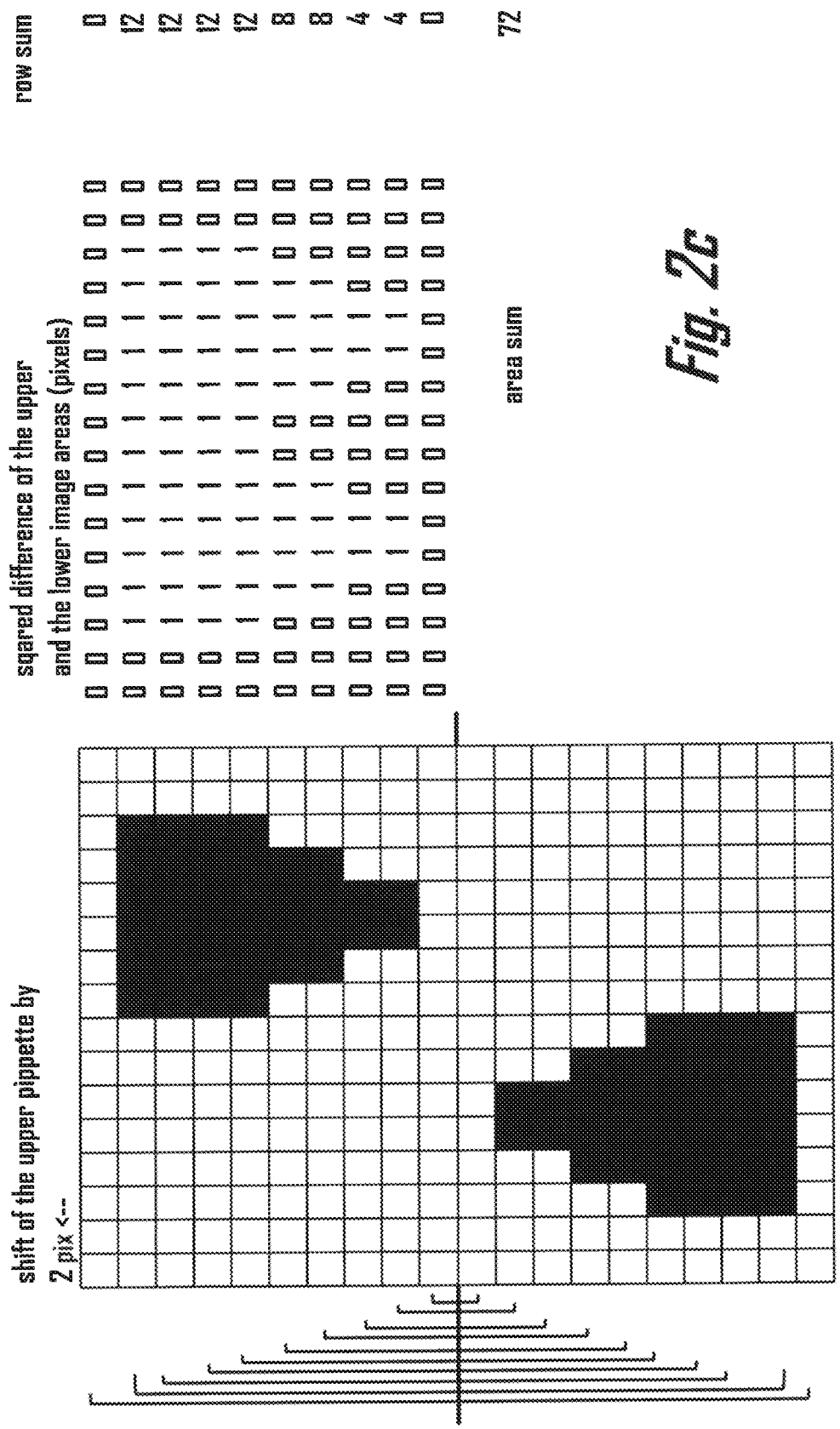
Figure 2D:
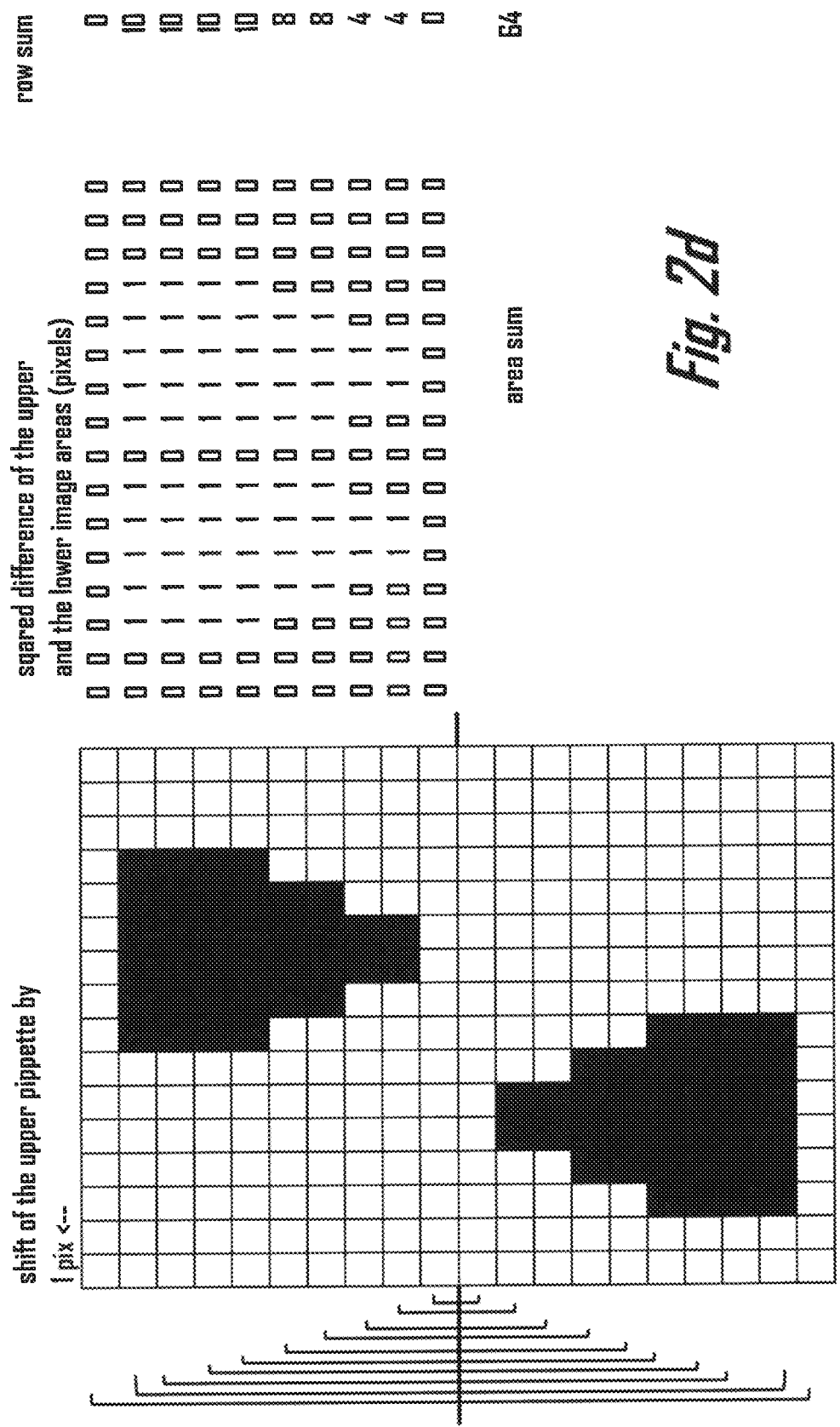
Figure 2E:
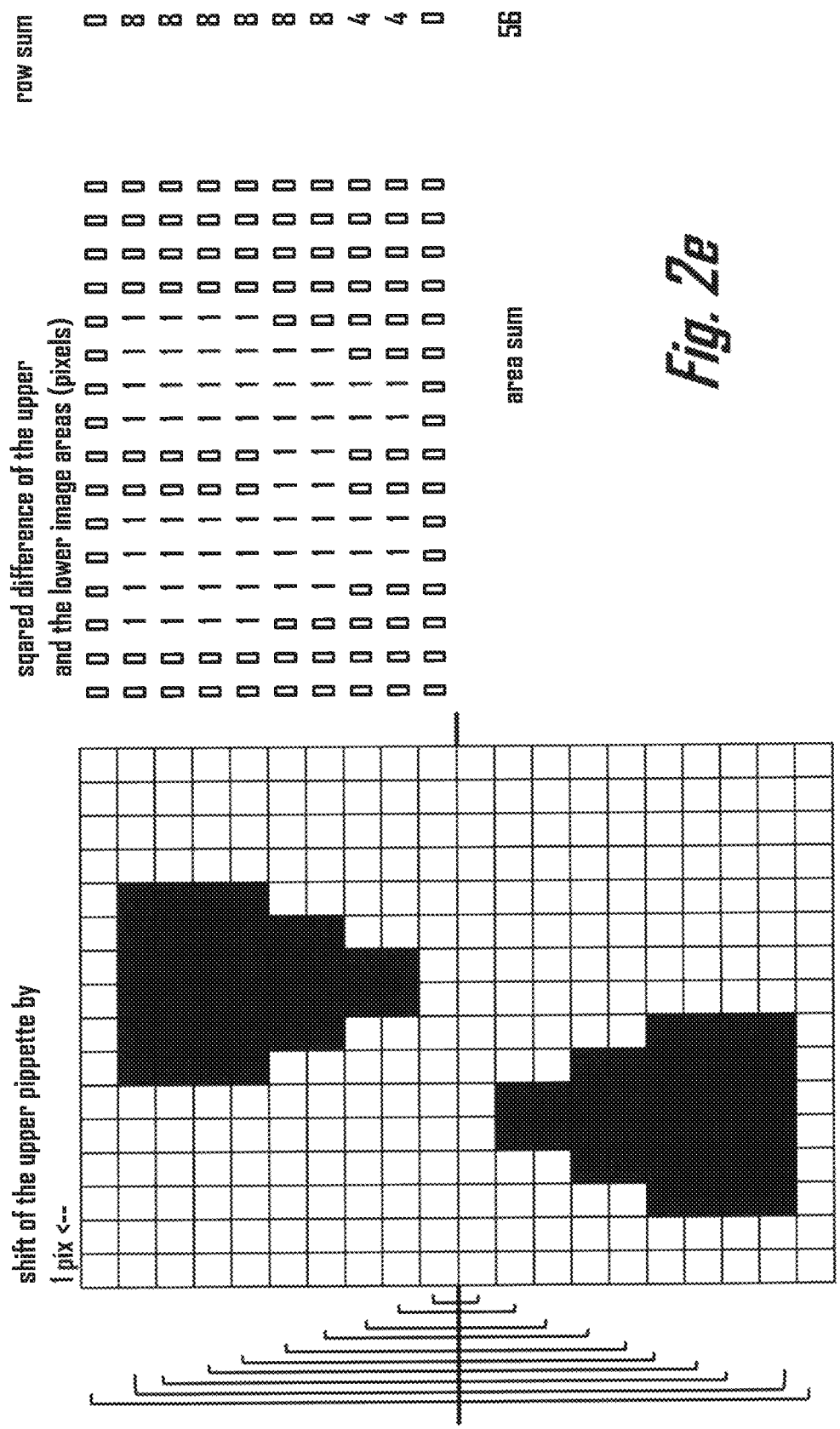

In step (vii), two cases are distinguished. If the second asymmetry measure A2 is greater than or equal to the first asymmetry measure A1, that is, if, as here, the case A2≥A1 holds, in a next step, the second conveying instrument F2 is adjusted in the opposite direction. Thus, the situation outlined in FIG. 2c is obtained. This is continued—as exemplarily sketched with reference to FIGS. 2i and 2j—the asymmetry dimension becomes larger again. Thus, if after an adjustment the asymmetry measure increases again, an adjustment of the second conveying instrument F2 in the opposite direction takes place. In this way, a relative setting of the two conveying instruments F1, F2 can be found in which the asymmetry measure has a minimum.

Figure 5A:
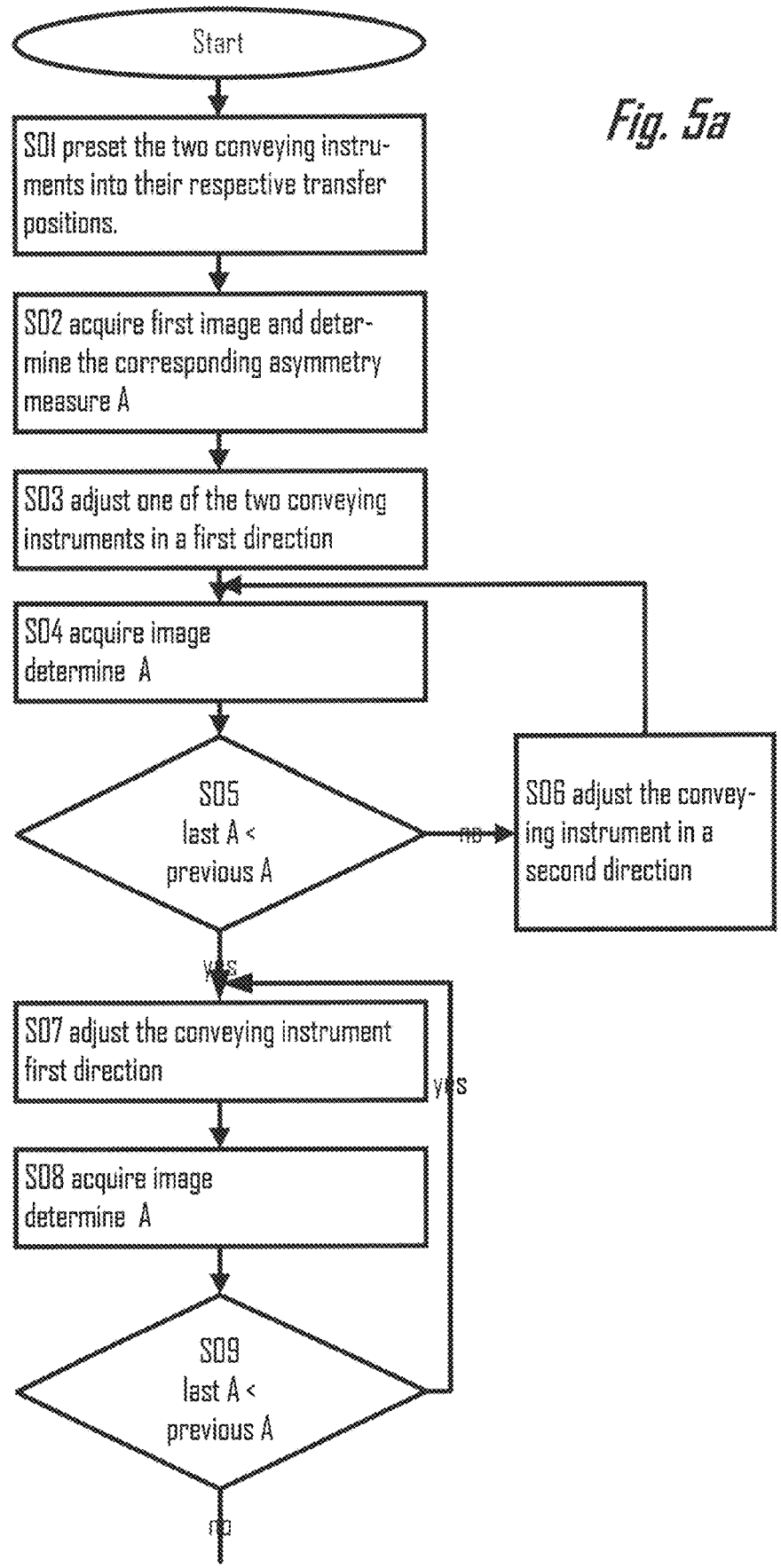

FIGS. 5a and 5b show a corresponding flow chart: In step S01, the two conveying instruments 101, 102 are moved by presetting so that the two conveying instruments F1, F2 are in their respective transfer positions. In step S02, the first image is acquired and the corresponding asymmetry measure is determined. In step S03, an adjustment of one of the two conveying instruments in a first direction follows. In step S04, a further image is acquired and the associated asymmetry measure is determined. In step S05, it is determined whether the most recently determined asymmetry measure has decreased compared to the immediately previously determined asymmetry measure. In other words, in step S05, it is inquired whether the symmetry has improved by the last adjustment. If this is not the case, an adjustment in the opposite direction takes place in step S06, and in the then following step S04 the acquisition of a further image and the determination of the associated asymmetry measure takes place again.

However, if it is determined in step S05 that the symmetry has improved, another adjustment in the same direction is performed in step S07. After performing step S07, an image is again acquired in step S08 and the corresponding asymmetry measure is determined. Then, in step S09, it is again determined whether the most recently determined asymmetry measure has decreased in comparison with the asymmetry measure determined immediately before. In other words, in step S09, it is inquired whether the symmetry has improved by the last adjustment. If the symmetry has improved, it goes back to step S07 and another adjustment is again made in the same direction. If it is determined in step S09 that the symmetry has not improved, an adjustment is made in the opposite direction in step S10, using a now smaller adjustment dimension.

In step S11, an image is again acquired and the associated asymmetry measure is determined. In step S12, it is determined again whether the last determined asymmetry measure has decreased in comparison to the asymmetry measure determined immediately before. If yes, it goes back to step S10 and a further adjustment is made. If no, using the imaging unit K1 is completed at step S13. The determined adjustment values are stored in a memory coupled to the control analysis unit 155. In a subsequent use of the component conveying instrument 100, the setting values can be used by the analysis unit 155 when the two conveying instruments F1, F2 are moved to their transfer positions by appropriately moving the conveying instruments F1, F2.

The following describes how, according to a first example, the asymmetry measure for an image is determined by the analysis unit 155.

The analysis unit 155 is set up to use a mirror axis SA for determining the asymmetry dimension, which—as sketched in FIG. 3 and also in FIG. 2a—is oriented perpendicular to the intended transfer path W. The mirror axis SA preferably intersects the transfer path W in its geometric center M. Preferably, the mirror axis SA intersects the transfer path W in its geometric center M.

Referring now to FIG. 2a, the steps performed by the analysis unit 155 to determine the asymmetry measure A1 for the first image B1 are explained. The image B1 has a first section H1 in which the end region E1 of the first conveying instrument F1 is shown, and a second section H2 in which the end region E2 of the second conveying instrument F2 is shown. Here, the first section H1 extends below the mirror axis SA and the second section H2 extends above the mirror axis SA.

The first image B1 is composed of many pixels $B_1$, $B_2$, $B_3$, . . . , each pixel having a certain grey value. In FIG. 2a, the second section H2 of the image B1 comprises a total of 160 pixels which are arranged in ten rows and sixteen columns. The grey value "1" is selected for black and the grey value "0" for white.

In a step (a), for each pixel $B_1$, $B_2$, $B_3$, . . . $B_{160}$ above the mirror axis SA, the respective grey value is detected.

In step (b), for each of these pixels $B_1$, $B_2$, $B_3$, . . . $B_{160}$, a mirrored pixel $B_1'$, $B_2'$, $B_3'$, . . . $B_{160}'$ is determined using the mirror axis SA and its grey value is detected. The mirrored pixels $B_1'$, $B_2'$, $B_3'$, . . . $B_{160}'$ are accordingly located below the mirror axis SA.

In step (c), a difference value $\Delta_1$, $\Delta_2$, $\Delta_3$, . . . $\Delta_{160}$ is determined for each of the pixels $B_1$, $B_2$, $B_3$, . . . $B_{160}$, respectively, by forming a difference between the grey value of the pixel $B_i$ in question and the grey value of the pixel $B_i'$ in question which is mirrored, and then squaring the difference. The difference values $\Delta_i$ thus obtained are indicated on the right in FIG. 2a in a corresponding grid.

In step (d), all the difference values $\Delta_1$, $\Delta_2$, $\Delta_3$, . . . $\Delta_{160}$ determined in this way are added up. In the example shown in FIG. 2a, this sum $\Sigma\Delta_i$ results in value "72", as indicated on the right in FIG. 2a.

Here, the sum $\Sigma\Delta_i$ formed in step (d) is selected as the asymmetry measure to the image in question. Thus, the asymmetry measure A1 of the first image B1 shown in FIG. 2a has the value 72.

Figure 2F:
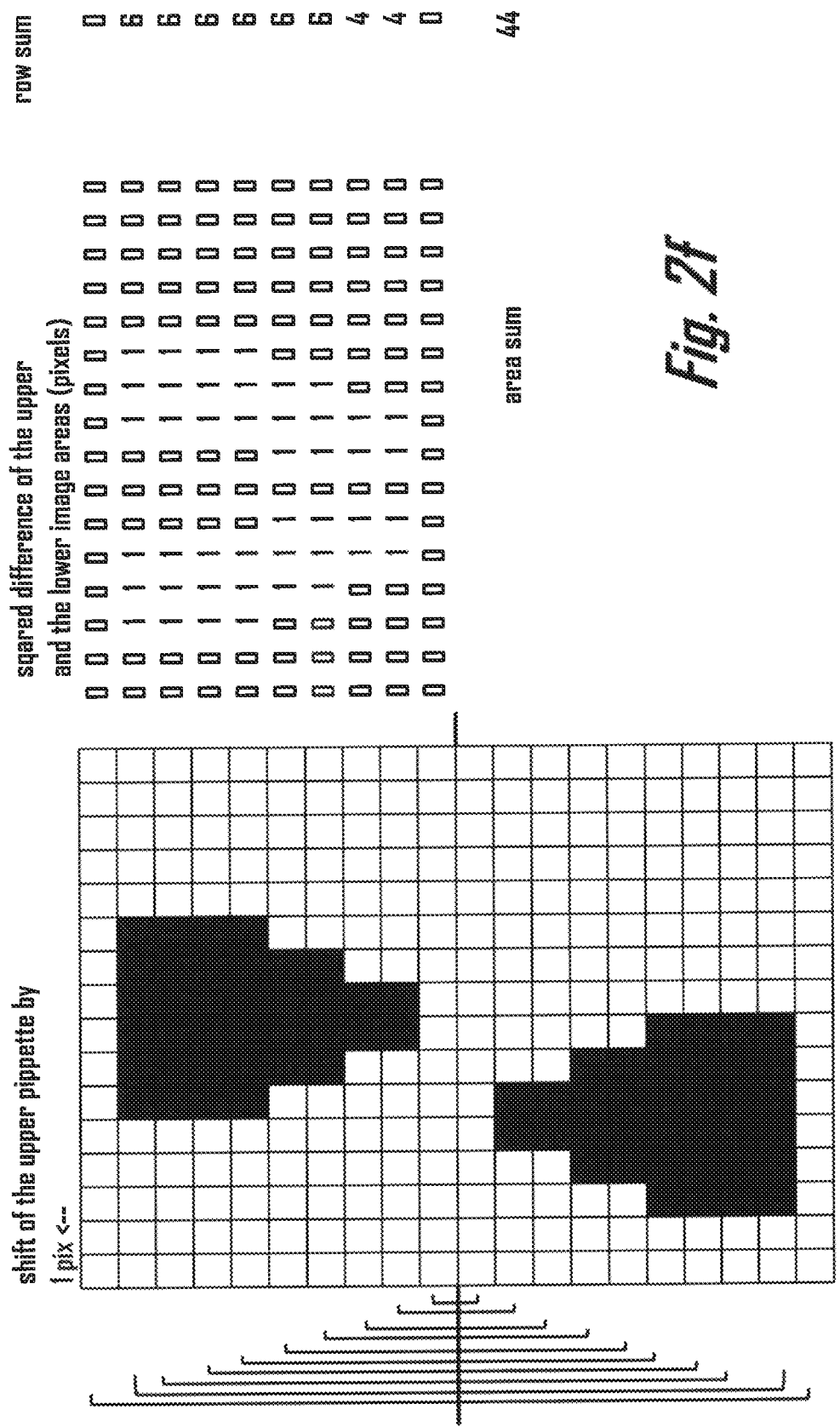
Figure 2G:
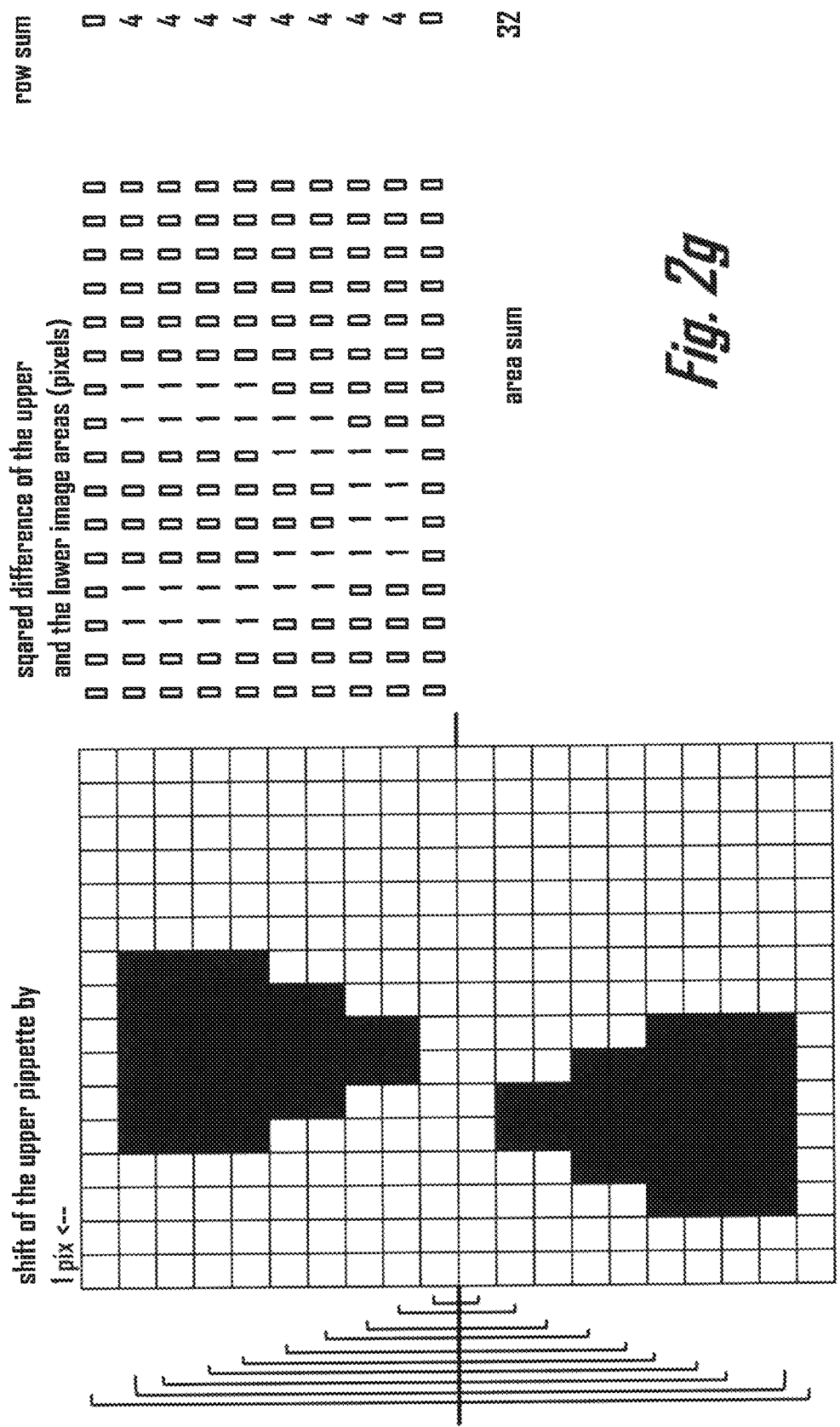
Figure 2H:
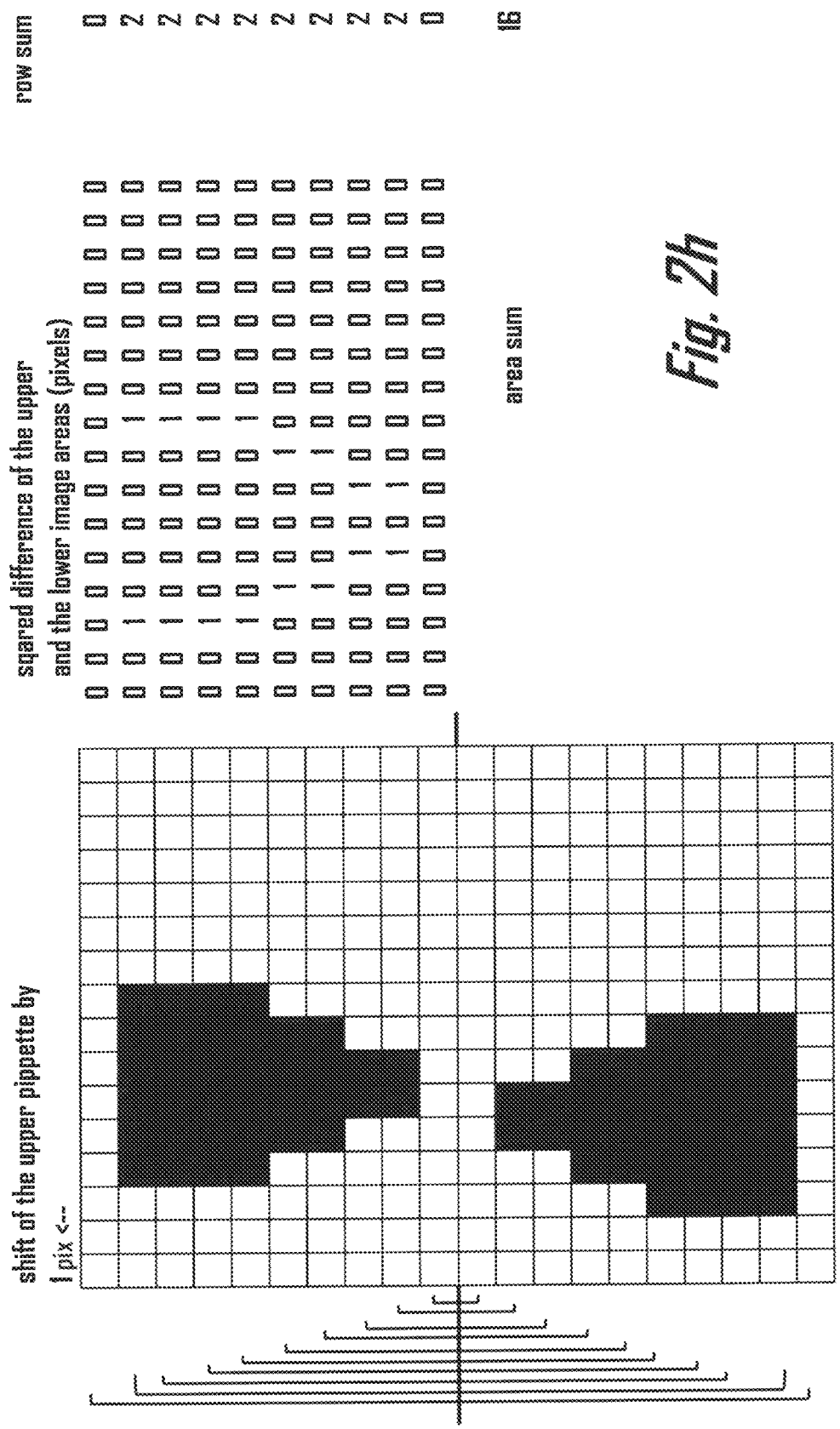
Figure 2I:
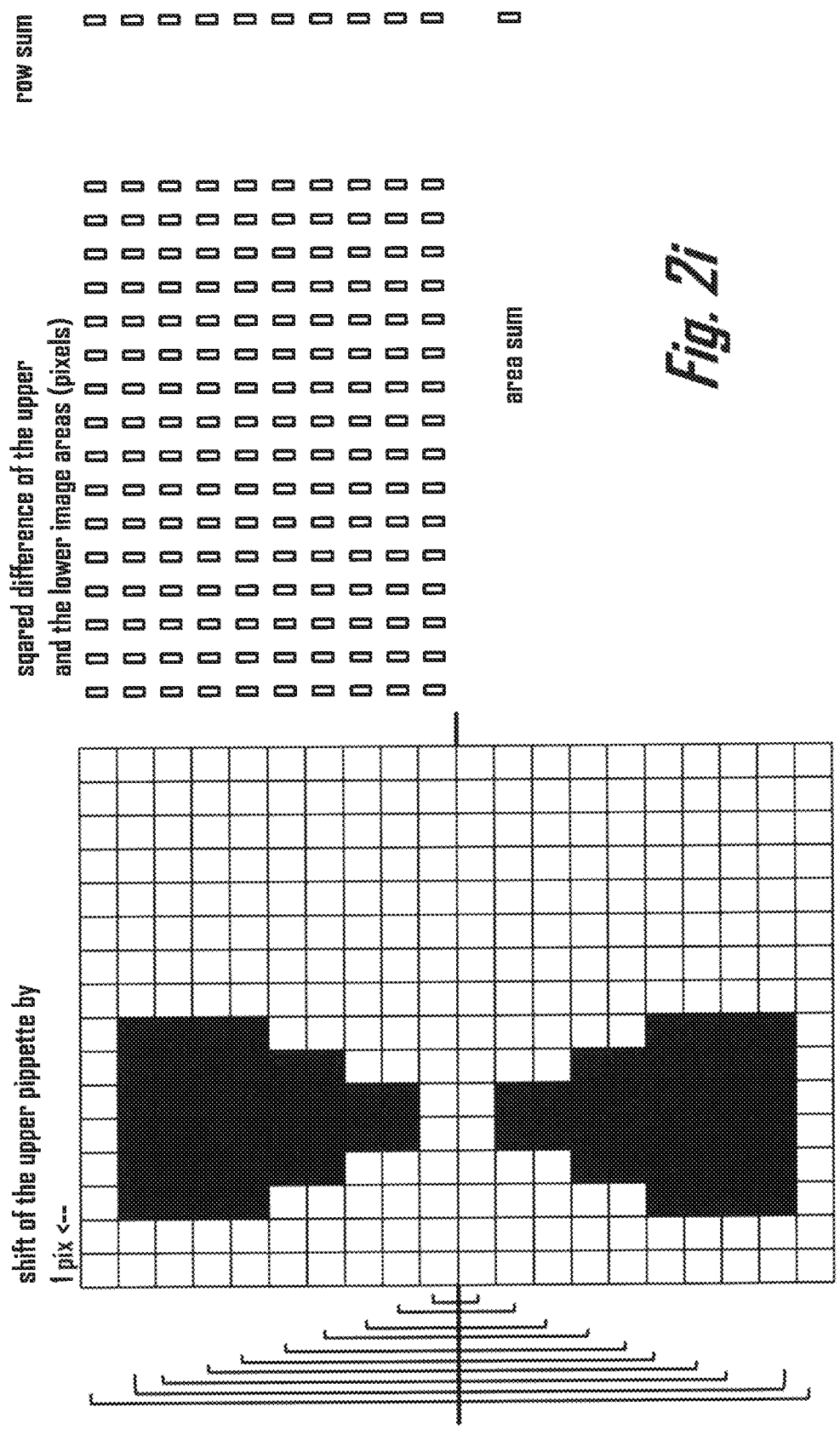
Figure 2J:
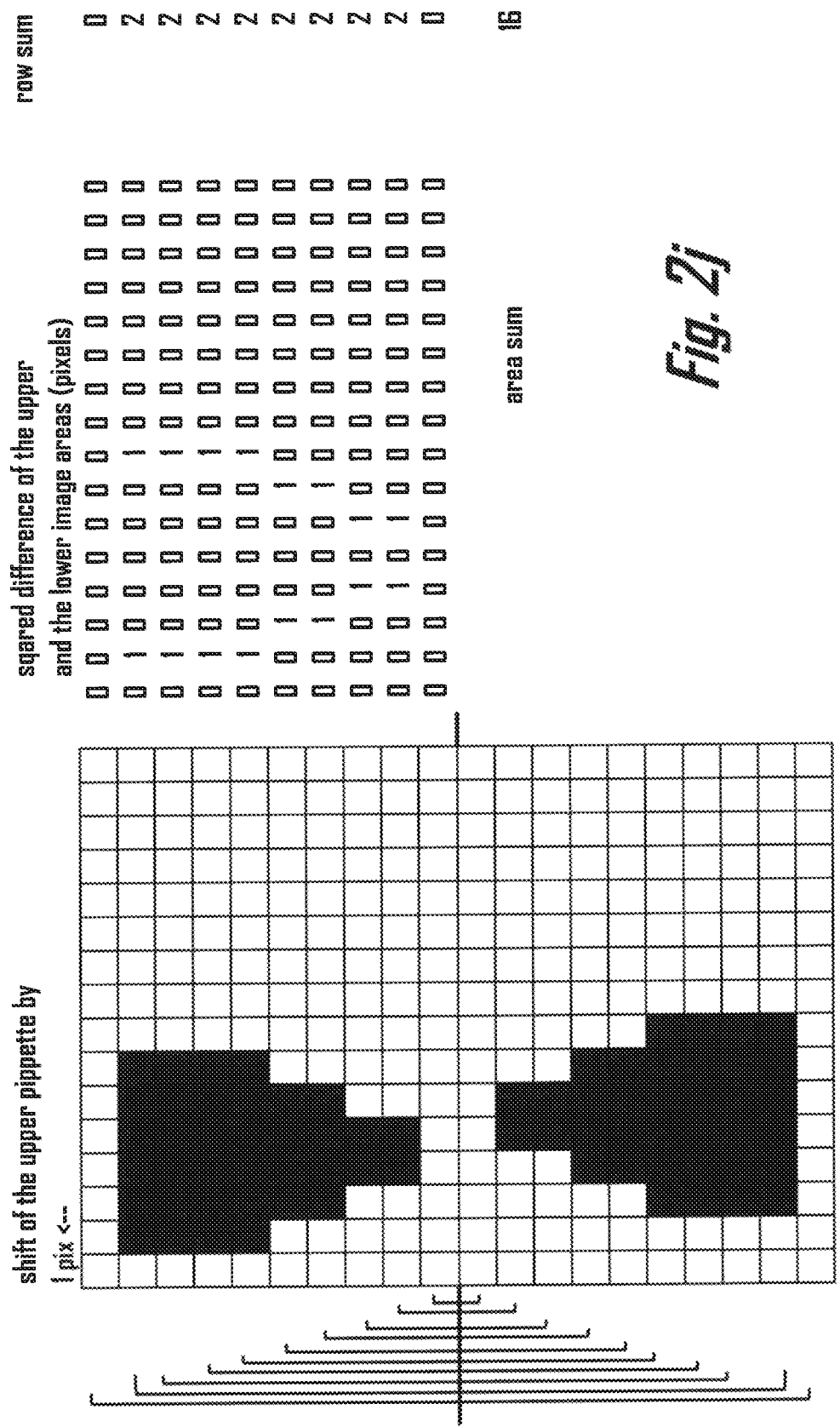
Figure 2K:
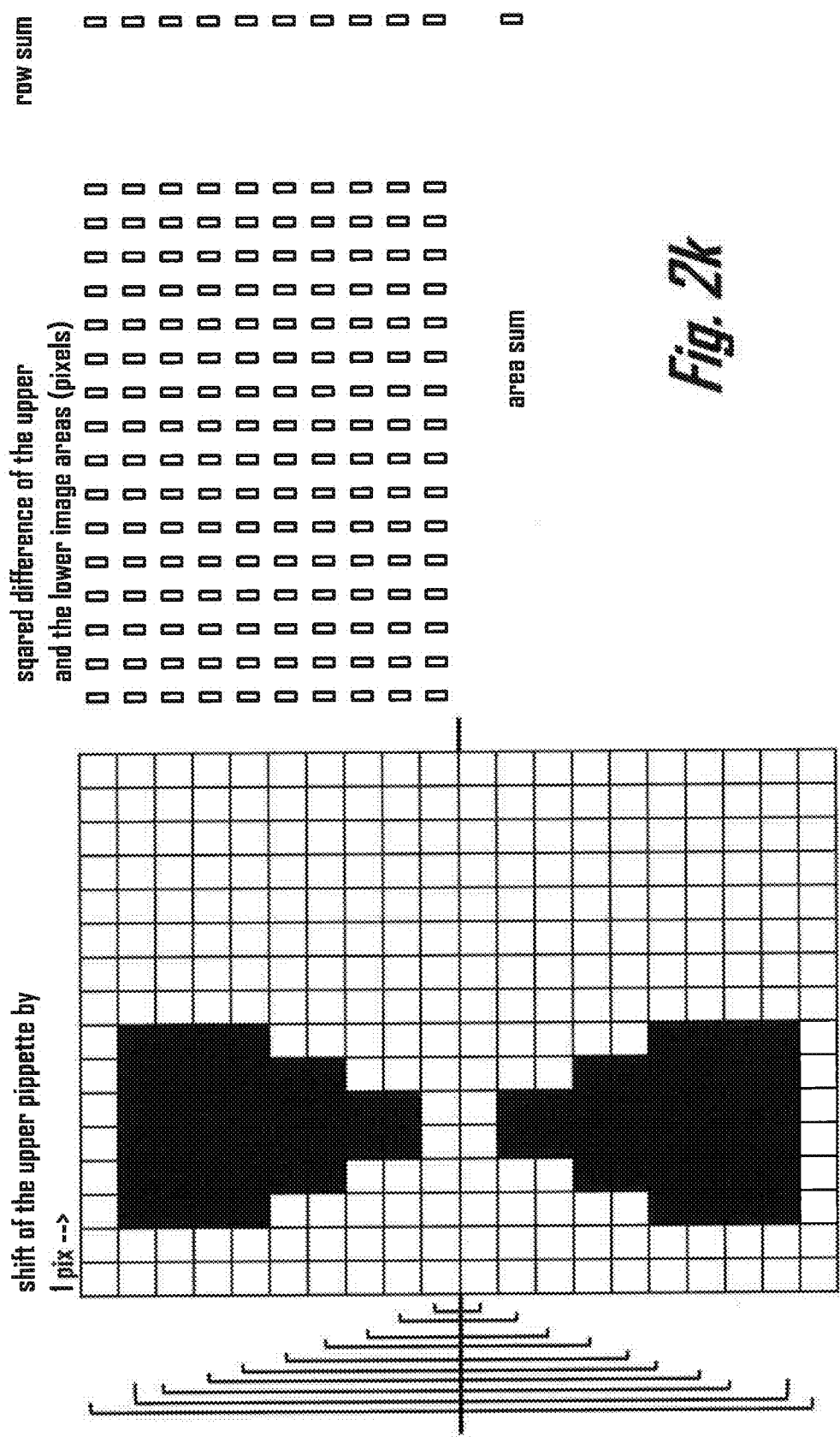
Figure 27:
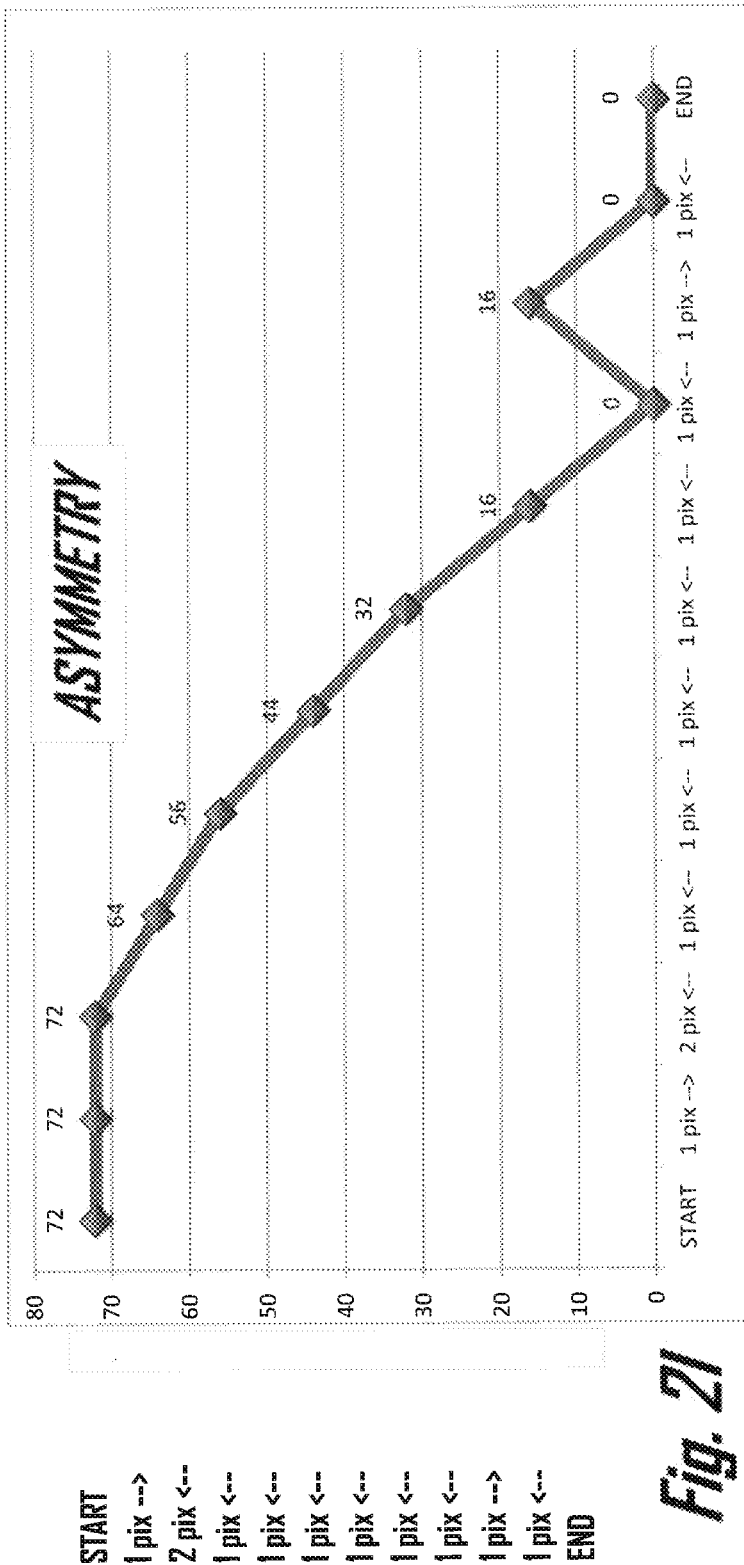

In the sixth image B6 shown in FIG. 2f, the asymmetry measure A6 has the value 44. Illustratively and simplified, "folding" the first conveying instrument F1 about the mirror axis SA results in an overlap area with the second conveying instrument F2 in which the difference values are zero. The larger this overlap area, the better the symmetry and thus the more aligned. In this way, as the overlap area increases, the asymmetry measure decreases.

In FIG. 2l, the asymmetry measures A1 to A11 of the eleven images B1 to B11 shown correspondingly in FIGS. 2a to 2k are plotted in a diagram.

According to a second example, the asymmetry measure may be determined using a mirror axis coinciding with the intended transfer path W, that is, with the major axis H of $_0$ the first conveying instrument F1.

As can be seen from a plausibility consideration based on FIG. 3, the fact that here the mirror axis coincides with the main axis $H_0$ means that the first conveying instrument F1 or its end region E1 is ideally aligned symmetrically to the mirror axis. If the second conveying instrument F2 has an offset with respect to the mirror axis, mirroring second conveying instrument F2 does not result in an overlap region in the sense mentioned above, or only in a very small overlap region and thus in a high value for the asymmetry dimension. If, however, the second conveying instrument F2 is ideally aligned, this results in a maximum overlap area and thus a minimum value for the asymmetry dimension.

Therefore, the above calculation steps can also be carried out in an analogous manner in this case.

According to a third example, the asymmetry measure can be determined by the following steps
  (a) A mirror image is created for the image in question, which is generated by a reflection about a mirror axis parallel to the path of motion W,
  (b) for each pixel of the image and the corresponding pixel of the mirror image the grey values are recorded, (c) then a difference value is determined in each case, which represents a measure of the difference between the grey value of the pixel and the grey value of the corresponding pixel of the mirror image, (d) all difference values determined in this way are added up, (e) Subsequently, starting from the image, at least one further mirror image is generated using at least one further mirror axis which is offset perpendicularly to the first-mentioned mirror axis, (f) Steps (a) to (d) are then repeated using the at least one further mirror image.

Then, the respective sums created in step (d) are compared and the mini mum of the sums is used as the asymmetry measure to the image in question.

The more mirror images are used, in general, a greater accuracy can be achieved.

Figure 4C:
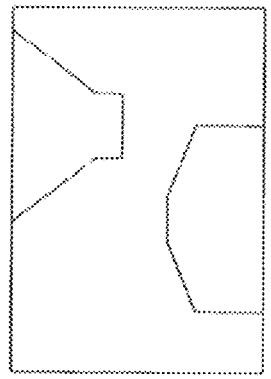
FIGS. 4a to 4c show schematic images of the transfer location exemplary for differently shaped conveying instruments.
Figure 4B:
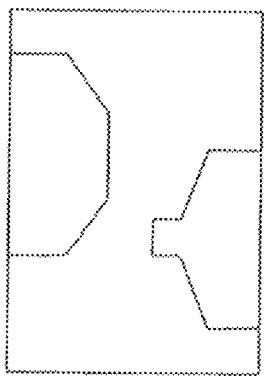
Figure 4A:
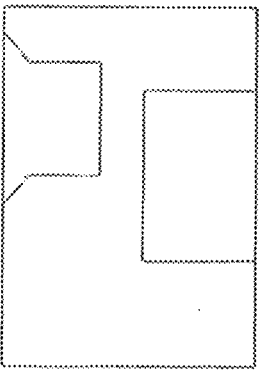

An advantage of the method described herein is that the adjustment by the adjustment unit 150 can also be carried out in the case of differently shaped conveying instruments, as exemplarily outlined in FIGS. 4a to 4c.

The variants of the device described above, as well as the structural and operational aspects thereof, are merely intended to provide a better understanding of the structure, operation and characteristics; they do not limit the disclosure to the variants. The figures are partially schematic, with essential features and effects sometimes shown in significantly enlarged form, in order to clarify the functions, operating principles, technical variants and features. In this regard, any—mode of operation, principle, technical variant and feature disclosed in the FIGS. or in the text may be freely and arbitrarily combined with any claim, feature in the text and in the other FIGS., other modes of operation, principles, technical variants and features contained in or resulting from the present disclosure, so that all conceivable combinations are attributable to the described method of operation. Combinations between all individual variants in the text, i.e. in each section of the description, in the claims and also combinations between different variants in the text, in the claims and in the FIGS. are also included. Also, the claims do not limit the disclosure and thus the combinations of all disclosed features with each other. All disclosed features are also explicitly disclosed herein individually and in combination with all other features.

The invention claimed is:

1. A method for conveying a component using a component conveying device, said method comprising:

conveying the component by a first conveying instrument and a second conveying instrument;

wherein the first conveying instrument is arranged to transfer the component to the second conveying instrument at a transfer location;

adjusting one of the first or second conveying instruments relative to the other conveying instrument along at least one or about at least one adjustment axis by an adjustment unit;

recording at least one image of the transfer location that shows at least one end region of the first conveying instrument in a first section and at least one end region of the second conveying instrument in a second section by a first imaging unit;

analyzing the at least one image by an analysis unit coupled to the adjustment unit, said analysis unit being configured to determine from the at least one image a measure of an asymmetry between the end region of the first conveying instrument and the end region of the second conveying instrument; and adjusting at least one of the conveying instruments with respect to the other conveying instrument along the at least one adjustment axis or about the at least one adjusting axis as a function of the determined asymmetry measure by said adjustment unit.

2. The method according to claim 1, wherein determining the asymmetry measure between the end region of the first conveying instrument and the end region of the second conveying instrument includes using a mirror axis, which is either oriented perpendicular to a transfer path of the component or coincides with the transfer path.

3. The method according to claim 2, wherein the asymmetry measure includes (a) detecting a grey value for each pixel on one side of the mirror axis, (b) determining the mirrored pixel for the pixel under consideration with the mirror axis in each case and to detect its grey value, (c) determining in each case a difference value which represents a measure of the difference between the grey value of the pixel and the grey value of the mirrored pixel, and (d) summing up all difference values determined in this way, wherein the sum formed in step (d) determines the asymmetry measure to the image.

4. The method according to claim 2, wherein the measure of asymmetry is determined by (a) creating a mirror image, which is generated by a reflection around a mirror axis, which is at least approximately parallel to the transfer path, (b) acquiring the grey values for each pixel of the image and the corresponding pixel of the mirror image, (c) determining in each case a difference value which represents a measure of the difference between grey value of the image point and the grey value of the corresponding image point of the mirror image, (d) summing up all the difference values determined in this way, (e) producing at least one further mirror image by moving the mirror image produced in step (a) in a direction perpendicular to the mirror axis, and (f) repeating steps (b) to (d) using the at least one further mirror image, wherein the respective sums produced in step (d) are compared and the minimum of the sums determines the asymmetry measure for the image concerned.

5. The method according to claim 2, further comprising making the first conveying instrument and/or the second conveying instrument is part of a conveying apparatus, which is mounted so as to be linearly movable along an axis and/or rotatable about an axis of rotation, wherein by a presetting movement of the conveying apparatus along the axis or about the axis of rotation the respective conveying instrument can be moved into a transfer position provided for the transfer of the component along the transfer path; wherein the adjustment unit is adapted to move the respective conveying instrument along the axis and/or to rotate about the axis of rotation for adjusting the transfer position of the respective conveying instrument.

6. The method according to claim 1, further comprising:

(i) acquiring a first image with the first imaging unit;

(ii) determining the asymmetry measure of the first image by the analysis unit;

adjusting one of the conveying instruments relative to the other conveying (iii) instrument in a first direction by the adjustment unit;

(iv) acquiring a second image with the first imaging unit;

(v) determining the asymmetry measure of the second image by the analysis unit;
(vi) comparing the asymmetry measure of the second image with the asymmetry measure of the first image by the analysis unit; and
(vii) if the asymmetry measure of the second image is smaller than the asymmetry measure of the first image further moving the one conveying instrument with respect to the respective other conveying instrument in the first direction by the adjustment unit, and if the asymmetry measure of the second image is greater than or equal to the symmetry measure of the first image moving one conveying instrument with respect to the other conveying instrument in a second direction opposite to the first direction by the adjustment unit.

7. The method according to claim 6, further comprising:
(viii) acquiring a third image with the first imaging unit;
(ix) determining the asymmetry measure of the third image by the analysis unit;
(x) comparing the asymmetry measure of the third image with the asymmetry measure of the second image by the analysis unit; and
(xi) if the asymmetry measure of the third image is smaller than the asymmetry measure of the second image, further moving the one conveying instrument with respect to the respective other conveying instrument in the direction of the last moving by the adjustment unit, and if the asymmetry measure of the third image is greater than or equal to the asymmetry measure of the second image, moving one conveying instrument with respect to the other conveying instrument in the opposite direction to the direction of the last movement by the adjustment unit.

8. The method according to claim 1, further comprising forming the first conveying instrument and/or the second conveying instrument by a pipette or an ejector or a pick-up having a suction contact point.

9. The method according to claim 8, further comprising making the first conveying instrument is a turning device on a linear axis.

10. The method according to claim 1, wherein the adjustment axis makes an angle with a main axis of the first conveying instrument which is between 70° and 110°.

11. The method according to claim 1, wherein a direction from the first imaging unit to the transfer location includes an angle with a main axis of the first conveying instrument that is between 70° and 110°.

12. The method according to claim 1, further comprising capturing at least one image of the transfer location by a second imaging unit, which in a first portion of the at least one image captured by the second imaging unit shows at least one end region of the first conveying instrument and in a second portion of the at least one image captured by the second imaging unit shows at least one end region of the second conveying instrument, wherein a direction from the second imaging unit to the transfer location differs from a direction from the first imaging unit to the transfer location.

13. The method according to claim 12, further comprising analyzing the at least one image captured by the second imaging unit and determining a further asymmetry measure between the end region of the first conveying instrument and the end region of the second conveying instrument by the analysis unit; wherein the adjustment unit is arranged to adjust at least one of the conveying instruments relative to the respective other conveying instrument along or about a further adjustment axis in dependence on the determined further measure of asymmetry.

14. A method for using a component conveying device having a first conveying instrument for conveying a component and a second conveying instrument for conveying the component, wherein the first conveying instrument is configured to transfer the component to the second conveying instrument at a transfer location, comprising the steps:
acquiring a first image of the transfer location with an imaging unit;
determining an asymmetry measure of the first image by an analysis unit;
adjusting one of the conveying instruments relative to the other conveying instrument in a first direction by an adjustment unit;
acquiring a second image of the transfer location with the imaging unit;
determining an asymmetry measure of the second image by the analysis unit;
comparing the asymmetry measure of the second image with the asymmetry measure of the first image by the analysis unit;
wherein if the asymmetry measure of the second image is smaller than the asymmetry measure of the first image further adjusting the one conveying instrument with respect to the respective other conveying instrument in the first direction by the adjustment unit; and
if the asymmetry measure of the second image is greater than or equal to the asymmetry measure of the first image, adjusting one of the conveying instruments relative to the other conveying instrument in a second direction opposite to the first direction by the adjustment unit.

* * * * *